(12) United States Patent
Nam et al.

(10) Patent No.: US 9,348,229 B2
(45) Date of Patent: May 24, 2016

(54) HARDMASK COMPOSITION AND METHOD OF FORMING PATTERNS USING THE HARDMASK COMPOSITION

(71) Applicant: SAMSUNG SDI CO., LTD., Yongin-si, Gyeonggi-do (KR)

(72) Inventors: Youn-Hee Nam, Suwon-si (KR); Hea-Jung Kim, Suwon-si (KR); Sang-Kyun Kim, Suwon-si (KR); Sung-Hwan Kim, Suwon-si (KR); Yun-Jun Kim, Suwon-si (KR); Joon-Young Moon, Suwon-si (KR); Hyun-Ji Song, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/528,029

(22) Filed: Oct. 30, 2014

(65) Prior Publication Data

US 2015/0187589 A1 Jul. 2, 2015

(30) Foreign Application Priority Data

Dec. 31, 2013 (KR) .................. 10-2013-0169274

(51) Int. Cl.
*G03F 7/11* (2006.01)
*H01L 21/308* (2006.01)
(Continued)

(52) U.S. Cl.
CPC *G03F 7/11* (2013.01); *C08G 69/32* (2013.01); *C08G 73/105* (2013.01); *C08G 73/1039* (2013.01); *C08G 73/1046* (2013.01);
(Continued)

(58) Field of Classification Search
CPC ............... G03F 7/11; G03F 7/30; G03F 7/20; G03F 7/40; H01L 21/0332; H01L 21/0381; H01L 21/312; H01L 21/02063; H01L 21/02118; C08G 73/1067; C08G 73/1078; C08G 73/10; C09D 179/08; C09D 135/00
USPC .............. 430/271.1, 322, 325, 329, 330, 331, 430/273.1, 316, 313; 438/690, 637; 427/98.3
See application file for complete search history.

(56) References Cited

U.S. PATENT DOCUMENTS

| | | | | |
|---|---|---|---|---|
| 6,929,890 B2 * | 8/2005 | Miyoshi | ................ | G03F 7/0007 430/191 |
| 7,364,835 B2 * | 4/2008 | Bhave | ..................... | G03F 7/091 430/270.1 |
| 8,895,230 B2 * | 11/2014 | Krishnamurthy | ...... | C08G 73/00 430/311 |

FOREIGN PATENT DOCUMENTS

JP 4086830 B2 5/2008
KR 10-2006-0019509 3/2006
(Continued)

OTHER PUBLICATIONS

Taiwanese Search Report dated Dec. 16, 2015.

*Primary Examiner* — Amanda C Walke
(74) *Attorney, Agent, or Firm* — Lee & Morse, P.C.

(57) ABSTRACT

A hardmask composition includes a polymer including a moiety represented by the following Chemical Formula 1 and a solvent.

[Chemical Formula 1]

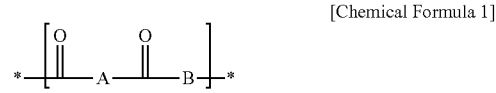

In the above Chemical Formula 1, A and B are as defined in the specification.

12 Claims, 1 Drawing Sheet

(51) Int. Cl.
| | |
|---|---|
| *H01L 21/02* | (2006.01) |
| *H01L 21/027* | (2006.01) |
| *H01L 21/306* | (2006.01) |
| *G03F 7/40* | (2006.01) |
| *G03F 7/20* | (2006.01) |
| *C09D 177/10* | (2006.01) |
| *C09D 179/08* | (2006.01) |
| *C08G 69/32* | (2006.01) |
| *C08G 73/10* | (2006.01) |

(52) U.S. Cl.
CPC .......... *C08G73/1071* (2013.01); *C09D 177/10* (2013.01); *C09D 179/08* (2013.01); *G03F 7/20* (2013.01); *G03F 7/40* (2013.01); *H01L 21/0214* (2013.01); *H01L 21/0217* (2013.01); *H01L 21/0276* (2013.01); *H01L 21/02118* (2013.01); *H01L 21/02282* (2013.01); *H01L 21/3081* (2013.01); *H01L 21/3086* (2013.01); *H01L 21/30604* (2013.01)

(56) References Cited

FOREIGN PATENT DOCUMENTS

| | | |
|---|---|---|
| KR | 10-2006-0126954 A | 12/2006 |
| KR | 10-2010-0062629 | 6/2010 |
| KR | 10-2010-0072660 A | 7/2010 |
| KR | 10-2010-0109947 | 10/2010 |
| KR | 10-2012-0088669 | 8/2012 |
| KR | 10-2007-0100333 | 11/2012 |
| KR | 10-2013-0003059 A | 1/2013 |
| TW | 201331265 A1 | 8/2013 |
| WO | WO 2013/100409 A1 | 7/2013 |

\* cited by examiner

HARDMASK COMPOSITION AND METHOD OF FORMING PATTERNS USING THE HARDMASK COMPOSITION

CROSS-REFERENCE TO RELATED APPLICATION

Korean Patent Application No. 10-2013-0169274 filed on Dec. 31, 2013, in the Korean Intellectual Property Office, and entitled: "Hardmask Composition and Method of Forming Patterns Using the Hardmask Composition," is incorporated by reference herein in its entirety.

BACKGROUND

1. Field

A hardmask composition and a method of forming patterns using the same are disclosed.

2. Description of the Related Art

Recently, the semiconductor industry has developed ultra-fine patterns in a size range of several to several tens of nanometers To provide such ultrafine patterns, effective lithographic techniques are desirable.

SUMMARY

Embodiments are directed a hardmask composition including a polymer including a moiety represented by the following Chemical Formula 1 and a solvent.

[Chemical Formula 1]

In the above Chemical Formula 1,
A is selected from the following Group 1, and
B is selected from the following Group 2.

[Group 1]

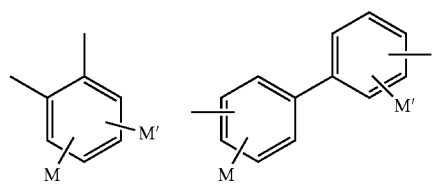

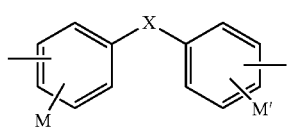

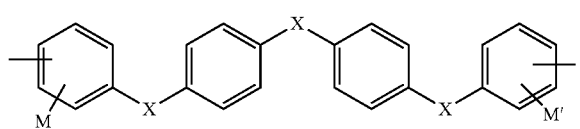

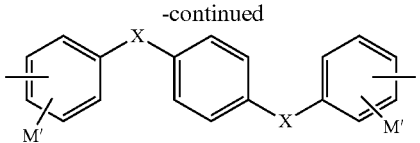

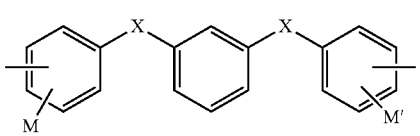

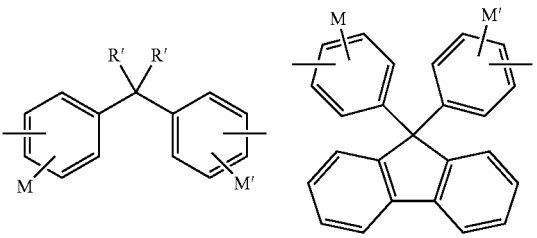

In Group 1,

M and M' are independently hydrogen or a carboxyl group (—COOH),

X is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, oxygen (O), sulfur (S), a carbonyl group (—C(=O)—), $SO_2$, $NR^a$, $siR^bR^c$, $PR^dR^eR^f$, or a combination thereof, and R and R' are independently hydrogen, a halogen, a hydroxy group, a thionyl group, a thiol group, a cyano group, a substituted or unsubstituted amino group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, a substituted or unsubstituted C1 to C20 alkylborane group, a substituted or unsubstituted C6 to C30 arylborane group, $CR^gR^hR^i$, or a combination thereof, wherein $R^a$, $R^b$, $R^c$, $R^d$, $R^e$, $R^f$, $R^g$, $R^h$ and $R^i$ are independently hydrogen, a substituted or unsubstituted C1 to C10 alkyl group, a halogen, a halogen-containing group, or a combination thereof.

[Group 2]

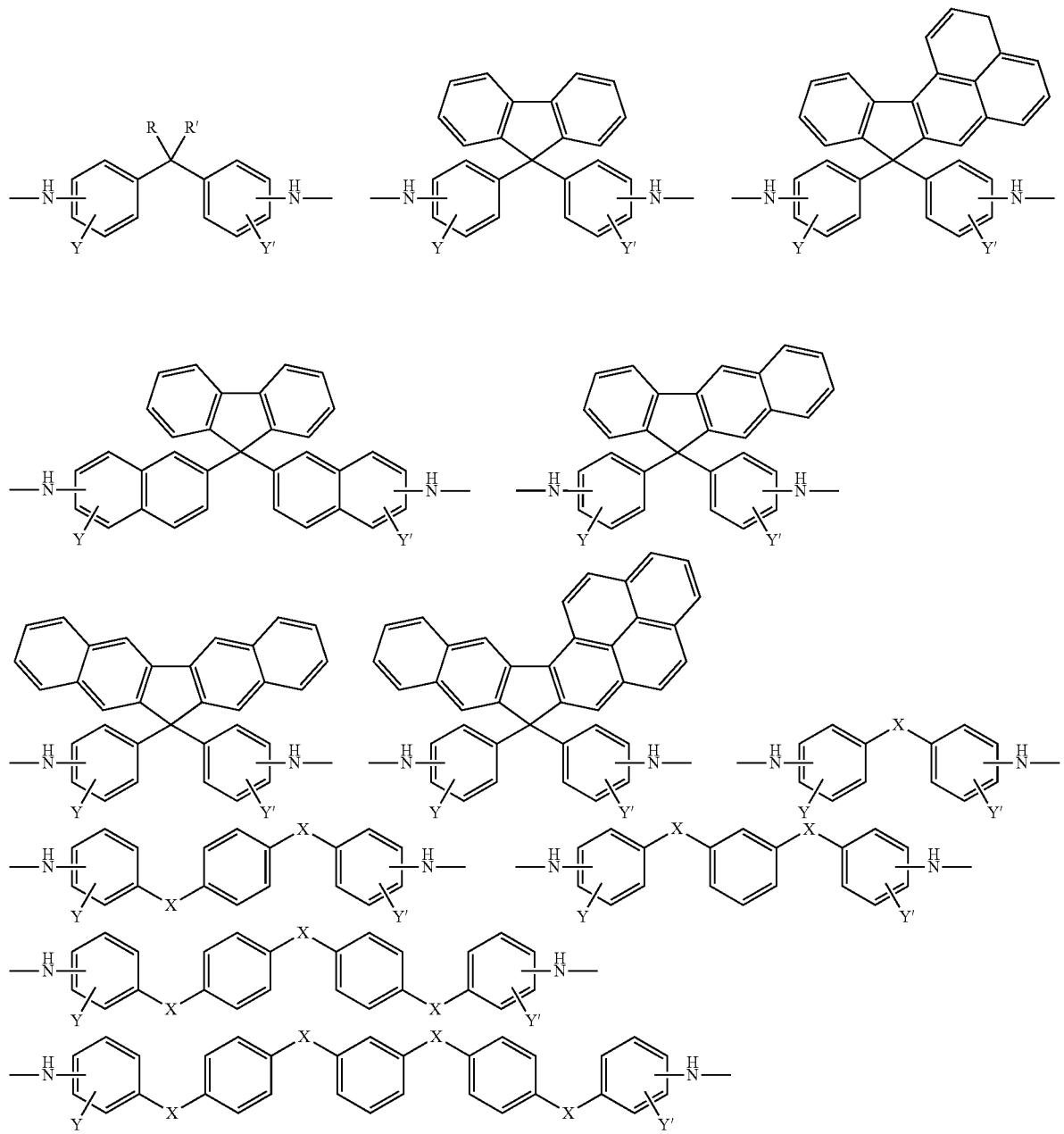

In Group 2,

Y and Y' are independently hydrogen, a hydroxy group, a thionyl group, a thiol group, a cyano group, a substituted or unsubstituted amino group, a substituted or unsubstituted C1 to C30 alkyl group, a substituted or unsubstituted C1 to C20 alkylamine group, a substituted or unsubstituted C1 to C30 alkoxy group, $NR^aR^b$, $COOR^c$, $PR^jR^kR^lR^m$, or a combination thereof, X, R and R' are the same as defined in Group 1, and $R^a$, $R^b$, $R^c$, $R^j$, $R^k$, $R^l$ and $R^m$ are independently hydrogen, a substituted or unsubstituted C1 to C10 alkyl group, a halogen, a halogen-containing group, or a combination thereof.

In Groups 1 and 2, R and R' may be independently hydrogen, a halogen, a hydroxy group, a thionyl group, a thiol group, a cyano group, a substituted or unsubstituted amino group, $CR^gR^hR^i$, or a combination thereof, where $R^g$, $R^h$ and R' are independently hydrogen, a substituted or unsubstituted C1 to C10 alkyl group, a halogen, a halogen-containing group, or a combination thereof.

In Groups 1 and 2, X may be independently oxygen (O), sulfur (S), CO, $SO_2$, $NR^a$, $SiR^bR^c$, $PR^dR^eR^f$, or a combination thereof, where $R^a$, $R^b$, $R^c$, $R^d$, $R^e$ and $R^f$ may be independently hydrogen, a substituted or unsubstituted C1 to C10 alkyl group, a halogen, a halogen-containing group, or a combination thereof.

The polymer may be represented by one of the following Chemical Formulae 2 to 7.

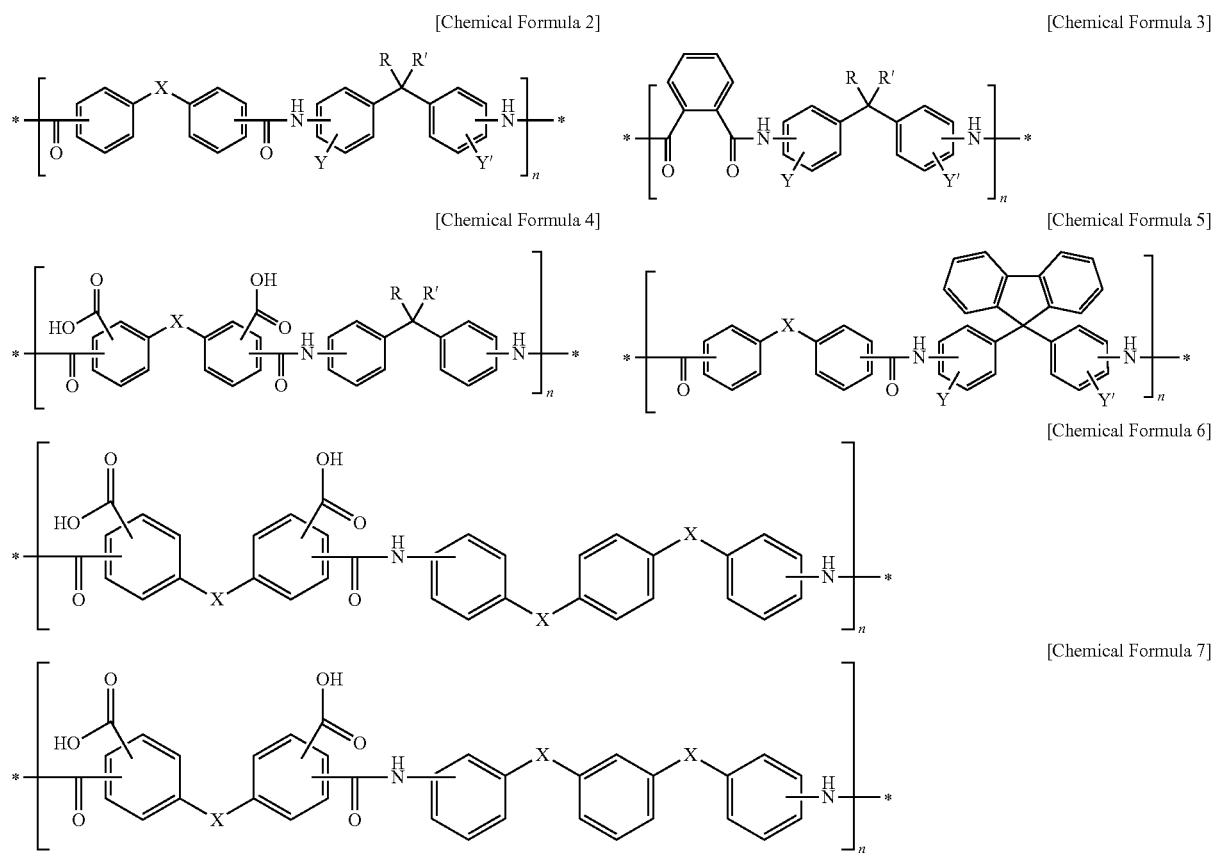

In the above Chemical Formulae 2 to 7,

X may be oxygen (O), sulfur (S), CO, $SO_2$, $NR^a$, $SiR^bR^c$, $PR^dR^eR^f$, or a combination thereof, Y and Y' may be independently a hydroxy group, a thionyl group, a thiol group, a cyano group, a substituted or unsubstituted amino group, a substituted or unsubstituted C1 to C30 alkyl group, a substituted or unsubstituted C1 to C20 alkylamine group, a substituted or unsubstituted C1 to C30 alkoxy group, $NR^aR^b$, $COOR^c$, $PR^jR^kR^m$, or a combination thereof, R and R' may be independently hydrogen, a halogen, a hydroxy group, a thionyl group, a thiol group, a cyano group, a substituted or unsubstituted amino group, $CR^gR^hR^i$, or a combination thereof, 2≤n≤10,000, and $R^a$, $R^b$, $R^c$, $R^d$, $R^e$, $R^f$, $R^g$, $R^h$, $R^i$, $R^j$, $R^k$, $R^l$ and $R^m$ may be independently hydrogen, a substituted or unsubstituted C1 to C10 alkyl group, a halogen, a halogen-containing group, or a combination thereof.

The polymer may have a weight average molecular weight of about 1,000 to about 200,000.

The solvent may include at least one selected from propylene glycol monomethyl ether acetate (PGMEA), propylene glycol monomethylether (PGME), cyclohexanone, N-methyl 2-pyrrolidone (NMP), and ethyl lactate.

The polymer may be present in the hardmask composition in an amount of about 0.01 to about 50 parts by weight based on 100 parts by weight of the solvent.

Embodiments are also directed to a method of forming patterns that includes providing a material layer on a substrate, applying the hardmask composition on the material layer to form a hardmask layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer and etching an exposed part of the material layer.

The hardmask composition may be applied using a spin-on coating method.

Forming the hardmask layer may include heat-treating at about 100° C. to about 500° C.

The method may further include forming a bottom antireflective coating (BARC) on the silicon-containing thin layer.

The silicon-containing thin layer may include silicon oxynitride (SiON), silicon nitride ($Si_3N_4$), or a combination thereof.

BRIEF DESCRIPTION OF THE DRAWING

Features will become apparent to those of skill in the art by describing in detail exemplary embodiments with reference to the attached drawing in which:

FIG. 1 illustrates a cross-sectional view showing a silicon wafer on the surface of which a hardmask composition is coated.

DETAILED DESCRIPTION

Example embodiments will now be described more fully hereinafter with reference to the accompanying drawing;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a substituted or unsubstituted C1 to C20 alkylborane group, a substituted or unsubstituted C6 to C30 arylborane group, a C1 to C4 alkoxy group, a C1 to C20 heteroalkyl group, a C3 to C20 heteroarylalkyl group, C3 to C30 cycloalkyl group, a C3 to C15 cycloalkenyl group, a C6 to C15 cycloalkynyl group, a C2 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

Hereinafter, a hardmask composition according to an embodiment is described.

A hardmask composition according to an embodiment includes a polymer including a moiety represented by the following Chemical Formula 1 and solvent.

[Chemical Formula 1]

$$*-\left[\begin{array}{c} O \\ \| \\ -A- \end{array} \begin{array}{c} O \\ \| \\ -B- \end{array}\right]-*$$

In the above Chemical Formula 1,
A is selected from the following Group 1, and
B is selected from the following Group 2.

[Group 1]

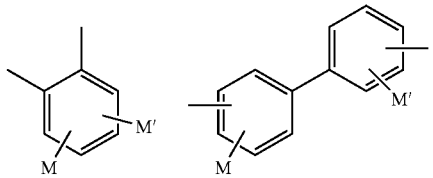

In Group 1,

M and M' are independently hydrogen or a carboxyl group (—COOH),

X is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, oxygen (O), sulfur (S), a carbonyl group (—C(=O)—), $SO_2$, $NR^a$, $SiR^bR^c$, $PR^dR^eR^f$, or a combination thereof, R and R' are independently hydrogen, a halogen, a hydroxy group, a thionyl group, a thiol group, a cyano group, a substituted or unsubstituted amino group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, a substituted or unsubstituted C1 to C20 alkylborane group, a substituted or unsubstituted C6 to C30 arylborane group, $CR^gR^hR^i$, or a combination thereof, where $R^a$, $R^b$, $R^c$, $R^d$, $R^e$, $R^f$, $R^g$, $R^h$ and $R^i$ are independently hydrogen, a substituted or unsubstituted C1 to C10 alkyl group, a halogen, a halogen-containing group, or a combination thereof.

[Group 2]

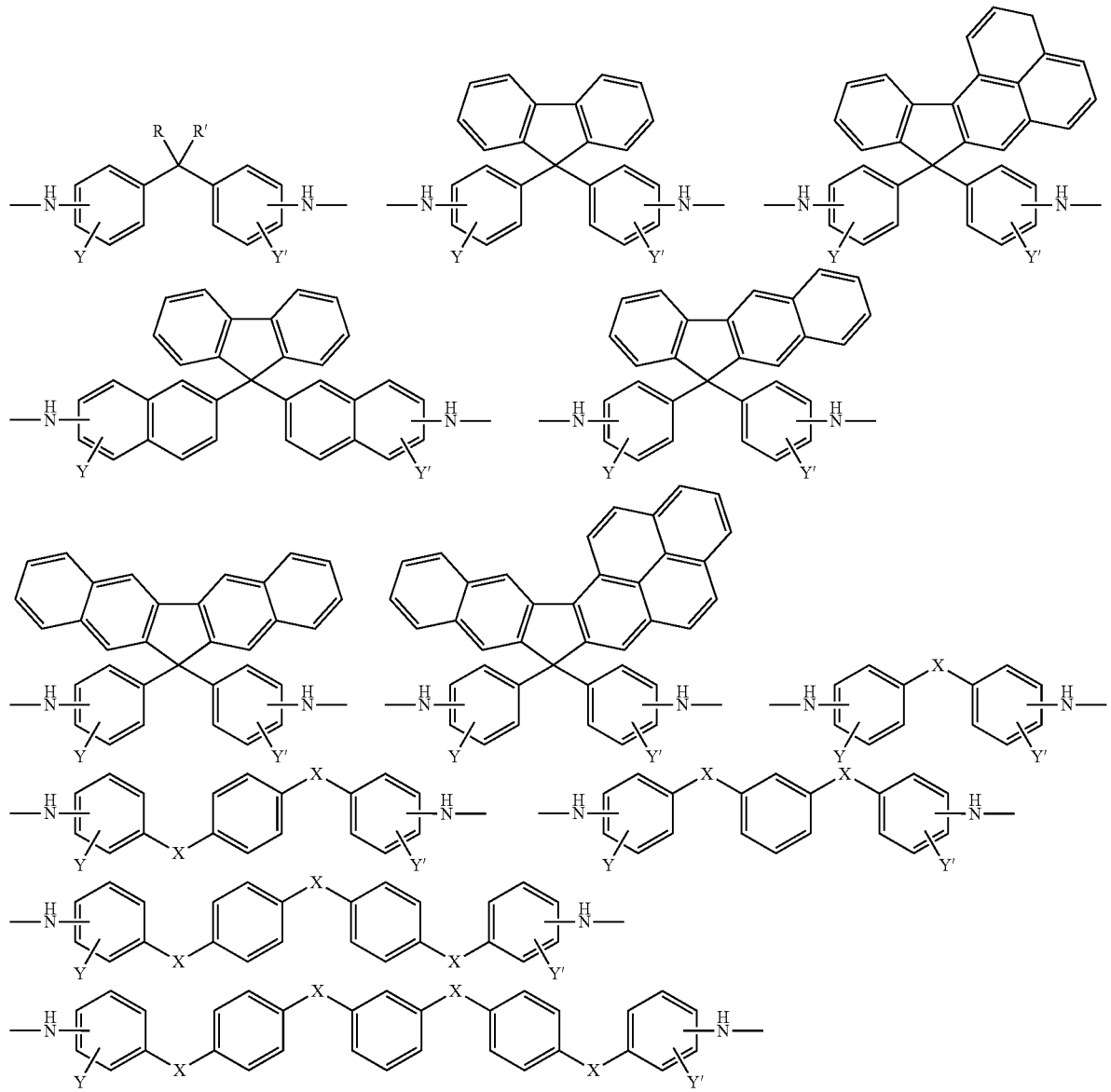

In Group 2,

Y and Y' are independently hydrogen, a hydroxy group, a thionyl group, a thiol group, a cyano group, a substituted or unsubstituted amino group, a substituted or unsubstituted C1 to C30 alkyl group, a substituted or unsubstituted C1 to C20 alkylamine group, a substituted or unsubstituted C1 to C30 alkoxy group, $NR^aR^b$, $COOR^c$, $PR^jR^kR^lR^m$, or a combination thereof, X, R and R' are the same as defined in Group 1, and $R^a$, $R^b$, $R^c$, $R^j$, $R^k$, $R^l$, and $R^m$ are independently hydrogen, a substituted or unsubstituted C1 to C10 alkyl group, a halogen, a halogen-containing group, or a combination thereof.

In Groups 1 and 2, the bonding position of each ring may vary. When a benzene ring in Group 1 is linked to the above Chemical Formula 1, the bonding position at both sides of the link is an ortho position. Herein, the ortho position may secure excellent heat resistance, solubility and planarization characteristics compared with a para position in which a benzene ring may be linked.

When the M and M' in Group 1 are hydrogen, and the Y and Y' in Group 2 are hydrogen, the above Chemical Formula 1 may form a polymer including an amide group (—CONH—) in the backbone, as an example.

When the M and M' in Group 1 is a carboxyl group (—COOH), the above Chemical Formula 1 may form a polymer including an amide group (—CONH—) and a carboxyl group (—COOH) in the backbone. When the polymer is heat-treated at a high temperature, the amide group (—CONH—) and the carboxyl group (—COOH) in the backbone may form an imide ring through a cyclization reaction.

When the M and M' in Group 1 are hydrogen, and Y and Y' in Group 2 are a hydroxy group, the above Chemical Formula 1 may form a polymer including an amide group (—CONH—) and a hydroxyl group (—OH) in its backbone.

When the polymer is heat-treated at a high temperature, the amide group (—CONH—) and the hydroxyl group (—OH) may form a benzoxazole ring through a cyclization reaction.

According to an embodiment, an imide or benzoxazole polymer may be formed. The polymer may be used to form a film without a separate cross-linking component. As a result of this self-curing reaction, the hardmask composition may exhibit excellent heat resistance, etch resistance, solubility and planarization characteristics and simultaneously, gap-fill characteristics.

In Groups 1 and 2, X may be oxygen (O), sulfur (S), a carbonyl group (—C(=O)—), $SO_2$, $NR^a$, $SiR^bR^c$, $PR^dR^eR^f$, or a combination thereof, as examples. For example, in Groups 1 and 2, R and R' may be independently hydrogen, a halogen, a hydroxy group, a thionyl group, a thiol group, a cyano group, a substituted or unsubstituted amino group, $CR^gR^hR^i$, or a combination thereof. $R^a$ to $R^i$ may be the same as defined above.

For example, the polymer may be represented by one of the following Chemical Formulae 2 to 7.

R and R' are independently hydrogen, a halogen, a hydroxy group, a thionyl group, a thiol group, a cyano group, a substituted or unsubstituted amino group, $CR^gR^hR^i$, or a combination thereof, $2 \leq n \leq 10{,}000$, and $R^a$, $R^b$, $R^c$, $R^d$, $R^e$, $R^f$, $R^g$, $R^h$, $R^i$, $R^j$, $R^k$, $R^l$, and $R^m$ are independently hydrogen, a substituted or unsubstituted C1 to C10 alkyl group, a halogen, a halogen-containing group, or a combination thereof.

The polymer may include a hetero aromatic ring in its backbone. The polymer may have excellent heat resistance and small thermal contraction during a process at a high temperature. A thin film formed of a hardmask composition including the polymer may provide excellent planarization characteristics.

In addition, the polymer may include a flexible linking unit and thus, flexibility of a resin may be improved. A thin film formed of a hardmask composition including the polymer may have an excellent coating property.

[Chemical Formula 2]

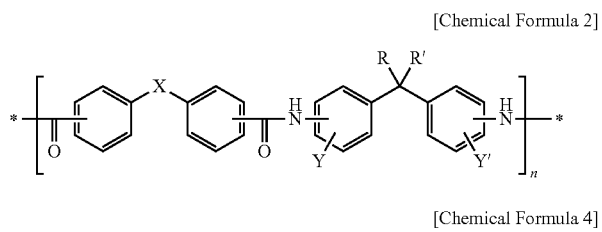

[Chemical Formula 3]

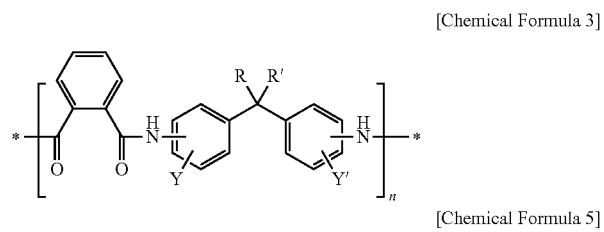

[Chemical Formula 4]

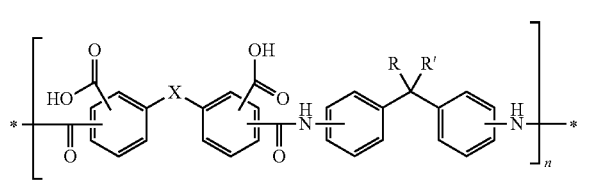

[Chemical Formula 5]

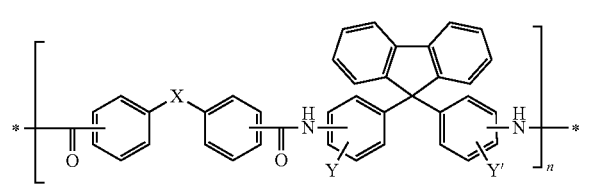

[Chemical Formula 6]

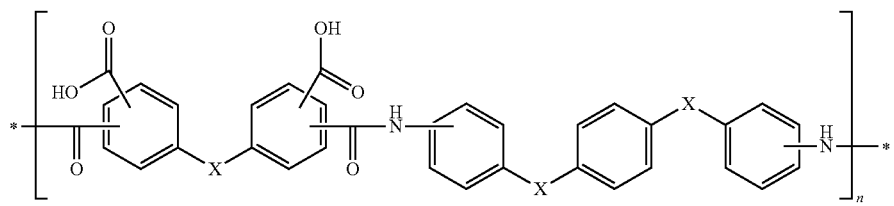

[Chemical Formula 7]

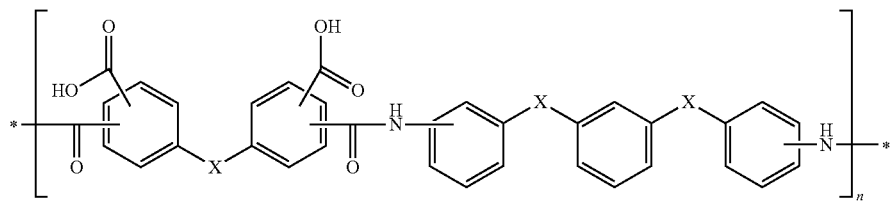

In the above Chemical Formulae 2 to 7,

X is oxygen (O), sulfur (S), a carbonyl group (—C(=O)—), $SO_2$, $NR^a$, $SiR^bR^c$, $PR^dR^eR^f$, or a combination thereof, Y and Y' are independently a hydroxy group, a thionyl group, a thiol group, a cyano group, a substituted or unsubstituted amino group, a substituted or unsubstituted C1 to C30 alkyl group, a substituted or unsubstituted C1 to C20 alkylamine group, a substituted or unsubstituted C1 to C30 alkoxy group, $NR^aR^b$, $COOR^c$, $PR^jR^kR^lR^m$, or a combination thereof, The polymer may include one kind of monomer by itself or may include two or more kinds of monomers in the hardmask composition.

The polymer may have a weight average molecular weight of about 1,000 to about 200,000, as examples.

The solvent in the hardmask composition may be a suitable solvent having sufficient dissolubility or dispersion with respect to the monomer and the polymer. The solvent may be, for example at least one selected from propylene glycol, propylene glycol diacetate, methoxy propanediol, diethylene glycol, diethylene glycol butyl ether, tri(ethylene glycol)

monomethylether, propylene glycol monomethylether, propylene glycol monomethylether acetate, cyclohexanone, ethyl lactate, gamma-butyrolactone, methyl pyrrolidone, and acetylacetone.

The polymer may be included in an amount of about 0.01 to about 50 parts by weight based on 100 parts by weight of the solvent. When the polymer is included within the above range, a desired thickness of a coated thin film may be obtained.

The hardmask composition may further include a surfactant.

The surfactant may include, for example, an alkylbenzene sulfonate salt, an alkyl pyridinium salt, polyethylene glycol, or a quaternary ammonium salt.

The surfactant may be included in an amount of about 0.001 to about 3 parts by weight based on 100 parts by weight of the hardmask composition. Within the amount range, the solubility may be secured without changing the optical properties of the hardmask composition.

Hereafter, a method for forming patterns by using the hardmask composition is described.

A method of forming patterns according to an embodiment includes providing a material layer on a substrate, applying the hardmask composition including the polymer including a moiety represented by Chemical Formula 1, as described above, and solvent on the material layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer, and the hardmask layer using the photoresist pattern to expose a part of the material layer and etching an exposed part of the material layer.

The substrate may be, for example, a silicon wafer, a glass substrate, or a polymer substrate.

The material layer may be a material to be finally patterned, for example a metal layer such as an aluminum layer or a copper layer, a semiconductor layer such as a silicon layer, or an insulation layer such as a silicon oxide layer or a silicon nitride layer. The material layer may be formed through a method such as chemical vapor deposition (CVD).

The hardmask composition may be applied in a form of a solution by spin-on coating. A thickness of the hardmask composition may be, for example about 100 Å to about 10,000 Å.

Heat-treating the hardmask composition may be performed, for example at about 100 to about 500° C. for about 10 seconds to 10 minutes. During heat-treating, the compound may undergo a self cross-linking and/or mutual cross-linking reaction.

The hardmask composition may include the polymer including the amide group (—CONH—) and the carboxyl group (—COOH) as described above. The amide group (—CONH—) and the carboxyl group (—COOH) may form an imide ring through a cyclization reaction during the heat treatment. In another implementation or in addition, the hardmask composition may include the polymer including the amide group (—CONH—) and the hydroxyl group (—OH) as described above. The amide group (—CONH—) and the hydroxyl group (—OH) may form a benzoxazole ring through a cyclization reaction during the heat treatment. The silicon-containing thin layer may be made of, for example, silicon nitride, silicon oxide, or silicon oxynitride (SiON).

The method may further include forming a bottom antireflective coating (BARC) on the silicon-containing thin layer. For example, a silicon oxynitride-containing thin layer may be formed on the hardmask layer, then a bottom antireflective coating may be formed, and subsequently a photoresist layer may be formed on the bottom antireflective coating.

Exposure of the photoresist layer may be performed using, for example ArF, KrF, or EUV. After exposure, heat treatment may be performed at about 100° C. to about 500° C.

The etching process of the exposed part of the material layer may be performed through a dry etching process using an etching gas. The etching gas may be, for example, $CHF_3$, $CF_4$, $Cl_2$, $BCl_3$, or a mixed gas thereof.

The etched material layer may be formed as a plurality of patterns. The plurality of patterns may be a metal pattern, a semiconductor pattern, an insulation pattern, or the like. For example, the plurality of patterns may be diverse patterns of a semiconductor integrated circuit device.

Patterns included in a semiconductor integrated circuit device may include, for example a metal line, a semiconductor pattern, an insulation layer including a contact hole, a bias hole, a damascene trench, or the like.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Polymer

Synthesis Example 1

3.6 g (10 mmol) of 2,2-bis(3-amino-4-hydroxyphenyl)-hexafluoropropane and 14.6 g of NMP were put in a 100 mL reactor and agitated with a stirring bar at room temperature.

When the 2,2-bis(3-amino-4-hydroxyphenyl)-hexafluoropropane was completely dissolved, the reactor was cooled down to 0° C., and 1.26 g (16 mmol) of pyridine was added thereto in a dropwise fashion. Subsequently, 2.4 g (8 mmol) of 4,4'-oxydibenzoyl chloride dissolved in 9.6 g of NMP was added thereto in a dropwise fashion at 0° C. while the reactor was agitated, and the reactor was agitated for two more hours. Then, after completely removing the pyridine from the mixed solution, the obtained powder was dissolved in THF, and subsequently, a precipitate was obtained from hexane. Then, a solvent remaining in the precipitate was removed in a 50° C. low pressure oven, obtaining a compound represented by the following Chemical Formula A. The obtained compound had a weight average molecular weight ranging from 7,000 to 8,000.

[Chemical Formula A]

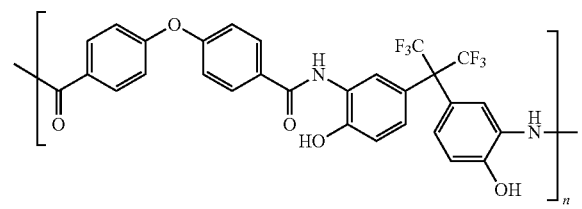

Synthesis Example 2

3.6 g (10 mmol) of 2,2-bis(3-amino-4-hydroxyphenyl)-hexafluoropropane and 14.6 g of NMP were put in a 100 mL reactor and agitated with a stirring bar at room temperature. When the 2,2-bis(3-amino-4-hydroxyphenyl)-hexafluoropropane was completely dissolved, the reactor was cooled down to 0° C., and 1.26 g (16 mmol) of pyridine was added thereto in a dropwise fashion. Subsequently, 1.6 g (8 mmol) of phthaloyl dichloride dissolved in 9.6 g of NMP was added thereto at 0° C. in a dropwise fashion while the reactor was agitated, and the reactor was agitated for two more hours. Then, after completely removing the pyridine from the mixed solution, the obtained powder was dissolved in THF, and subsequently, a precipitate was obtained from hexane. Then, a solvent remaining in the precipitate was removed in a 50° C. low pressure oven, obtaining a compound represented by the following Chemical Formula B. The obtained compound had a weight average molecular weight ranging from 1,100 to 1,500.

[Chemical Formula B]

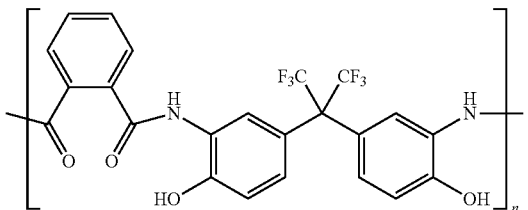

Synthesis Example 3

3.6 g (10 mmol) of 2,2-bis(4-aminophenyl)hexafluoropropane and 30.5 g of THF were put in a 100 mL reactor and agitated with a stirring bar at room temperature. Subsequently, 2.5 g (8 mmol) of 5,5'-oxydiisobenzofuran-1,3-dione was added thereto in a dropwise fashion. The mixed solution was agitated at room temperature for 15 hours, and powder obtained from the precipitation of the mixed solution was several times rinsed. Then, a solvent remaining in the powder was removed in a 50° C. low pressure oven, obtaining a compound represented by the following Chemical Formula C. The obtained compound had a weight average molecular weight ranging from 2,000 to 2,500.

Synthesis Example 4

3.8 g (10 mmol) of 2,2'-diamino-4,4'-(9-fluorenylidene) diphenol and 15.2 g of NMP were put in a 100 mL reactor and agitated with a stirring bar at room temperature. When the 2,2'-diamino-4,4'-(9-fluorenylidene)diphenol was completely dissolved, the reactor was cooled down to 0° C., and 1.26 g (16 mmol) of pyridine was added thereto in a dropwise fashion. Subsequently, 2.4 g (8 mmol) of 4,4'-oxydibenzoyl chloride dissolved in 9.6 g of NMP was added thereto in a dropwise fashion at 0° C. while the reactor is agitated, and the reactor was agitated for two more hours. Then, powder obtained by precipitating the mixed solution in water after 2 hours was several times rinsed to completely remove the pyridine. Then, after completely removing the pyridine from the mixed solution, the powder obtained therefrom was dissolved in THF, and a precipitate was subsequently obtained from hexane. Subsequently, a solvent remaining in the precipitate was removed in a 50° C. low pressure oven, obtaining a compound represented by the following Chemical Formula D. The obtained compound had a weight average molecular weight ranging from 12,000 to 13,000.

[Chemical Formula D]

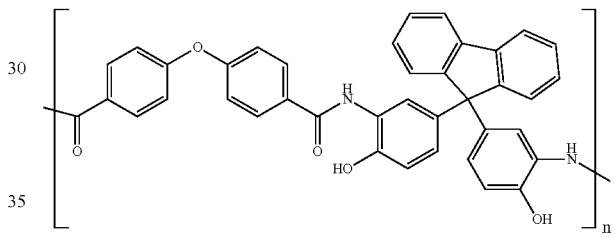

Synthesis Example 5

3.87 g (12 mmol) of 5,5'-carbonyldiisobenzofuran-1,3-dione, 4.38 g (15 mmol) of 4,4'-(1,4-phenylenebis(oxy))dianiline and 41.26 g of NMP were put in a 100 mL reactor with a stirring bar and agitated at 80° C. for 3 hours. The mixed solution was cooled down to room temperature, and powder obtained by precipitating the mixed solution in water was several times rinsed. Subsequently, a solvent remaining in the precipitate was removed in a 50° C. low pressure oven, obtaining a compound represented by the following Chemical Formula E. The obtained compound had a weight average molecular weight ranging from 1,500 to 2,000.

[Chemical Formula C]

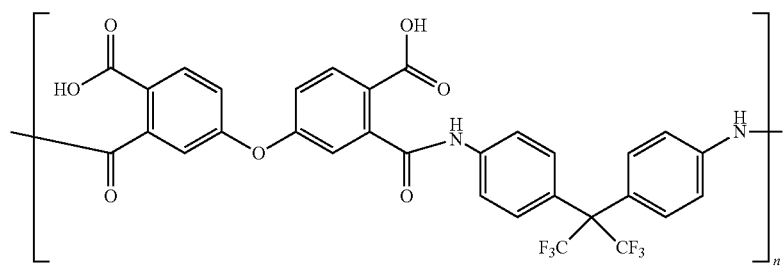

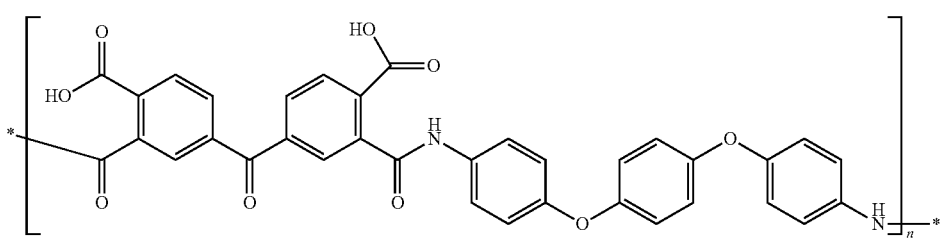

[Chemical Formula E]

Synthesis Example 6

2.48 g (8 mmol) of 5,5'-oxydiisobenzofuran-1,3-dione, 2.92 g (10 mmol) of 3,3'-(1,3-phenylenebis(oxy))dianiline and 27.02 g of NMP were put in a 100 mL reactor and agitated with a stirring bar at 80° C. for 3 hours. The mixed solution was cooled down to room temperature, and a powder obtained by precipitating the mixed solution in water was several times rinsed. Subsequently, a solvent remaining in the powder was removed in a 50° C. low pressure oven, obtaining a compound represented by the following Chemical Formula F. The compound had a weight average molecular weight ranging from 1,500 to 2,000.

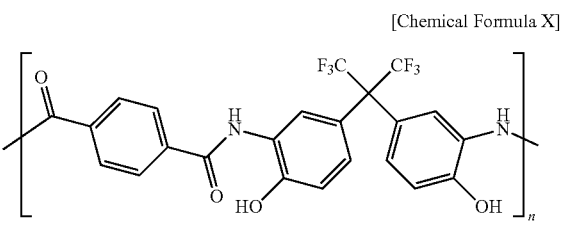

[Chemical Formula X]

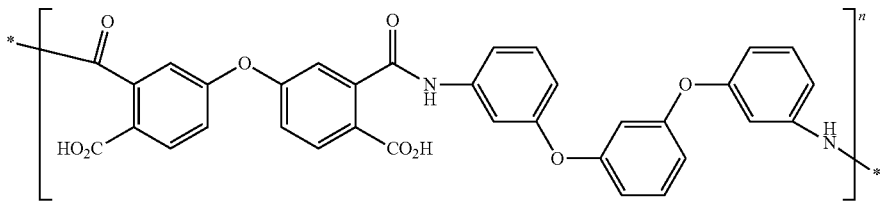

[Chemical Formula F]

Comparative Synthesis Example 1

3.6 g (10 mmol) of 2,2-bis(3-amino-4-hydroxyphenyl)-hexafluoropropane and 14.6 g of NMP were put in a 100 mL reactor and then, agitated with a stirring bar at room temperature. When the 2,2-bis(3-amino-4-hydroxyphenyl)-hexafluoropropane was completely dissolved, the reactor was cooled down to 0° C., and 1.26 g (16 mmol) of pyridine was added thereto in a dropwise fashion. Subsequently, 1.6 g (8 mmol) of terephthaloyl dichloride dissolved in 6.4 g of NMP was added thereto in a dropwise fashion at 0° C. while the reactor was agitated, and the reactor was agitated for two more hours. Then, after completely removing the pyridine from the mixed solution, the obtained powder was dissolved in THF, and subsequently, a precipitate was obtained from hexane. Then, a solvent remaining in the precipitate was removed in a 50° C. low pressure oven, obtaining a compound represented by the following Chemical Formula X. The obtained compound had a weight average molecular weight ranging from 2,500 to 3,000.

Comparative Synthesis Example 2

A 500 ml 3-necked flask equipped with a thermometer, a condenser and a mechanical agitator was dipped in a 90 to 100° C. oil thermostat. A stirring bar was used to perform agitation while the flask was maintained at a constant temperature. Subsequently, 28.83 g (0.2 mol) of 1-naphthol, 41.4 g (0.15 mol) of benzoperylene and 12.0 g (0.34 mol) of paraformaldehyde were put in the 3-necked flask, 0.19 g (1 mmol) of p-toluene sulfonic acid monohydrate dissolved in 162 g of propylene glycol monomethyl ether acetate (PG-MEA) was added thereto, and the mixture was agitated and reacted for 5 to 12 hours.

The reaction was completed when a specimen taken by every one hour from the polymerization reactant had a weight average molecular weight ranging from 1,800 to 2,500.

When the polymerization reaction was complete, the reactant was slowly cooled down to room temperature and added to 40 g of distilled water and 400 g of methanol, and the mixture was strongly agitated and allowed to stand. After removing a supernatant therefrom, the obtained precipitate was dissolved in 80 g of propylene glycol monomethyl ether acetate (PGMEA), and the solution was strongly agitated by using 320 g of methanol (first process). Herein, a supernatant produced therefrom was removed again, a precipitate remaining there was dissolved in 80 g of propylene glycol monomethyl ether acetate (PGMEA) (second process). The first and second processes were regarded as one refinement process, and the refinement process was three times in total repeated. The refined polymer was dissolved in 80 g of propylene glycol monomethyl ether acetate (PGMEA), and methanol and distilled water remaining in the solution was removed under a reduced pressure. An aromatic ring-containing compound represented by the following Chemical Formula Y was obtained.

[Chemical Formula Y]

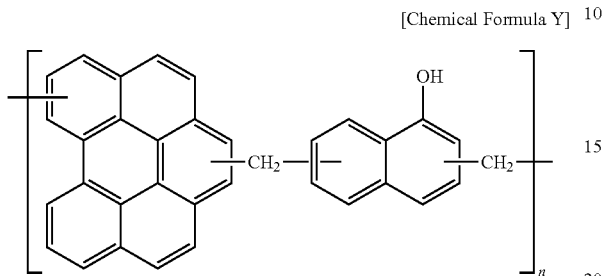

Preparation of Hardmask Composition

Example 1

The compound according to Synthesis Example 1 was dissolved in a mixed solvent obtained by mixing propylene glycolmonomethyl ether acetate (PGMEA) and cyclohexanone (7:3 (v/v)) and then, filtered, preparing a hardmask composition. The amount of the compound was adjusted within a range of 8-13 wt % based on the total width of the hardmask composition depending on a desired thickness.

Example 2

A hardmask composition was manufactured according to the same method as Example 1 except for using the compound according to Synthesis Example 2 instead of the compound according to Synthesis Example 1.

Example 3

A hardmask composition was manufactured according to the same method as Example 1 except for using the compound according to Synthesis Example 3 instead of the compound according to Synthesis Example 1.

Example 4

A hardmask composition was manufactured according to the same method as Example 1 except for using the compound according to Synthesis Example 4 instead of the compound according to Synthesis Example 1.

Example 5

A hardmask composition was manufactured according to the same method as Example 1 except for using the compound according to Synthesis Example 5 instead of the compound according to Synthesis Example 1.

Example 6

A hardmask composition was manufactured according to the same method as Example 1 except for using the compound according to Synthesis Example 6 instead of the compound according to Synthesis Example 1.

Comparative Example 1

A hardmask composition was manufactured according to the same method as Example 1 except for using the compound according to Comparative Synthesis Example 1 instead of the compound according to Synthesis Example 1.

Comparative Example 2

A hardmask composition was manufactured according to the same method as Example 1 except for using the compound according to Comparative Synthesis Example 2 instead of the compound according to Synthesis Example 1.

Evaluation

Evaluation 1: Gap-Fill and Planarization Characteristics

The hardmask compositions according to Examples 1 to 4 and 6 and Comparative Example 1 were respectively spin-coated to be 2900 Å thick on a patterned silicon wafer.

Subsequently, the coated hardmask compositions were heat-treated on a 400° C. hot plate for 120 seconds, and the gap-fill characteristics and planarization characteristics of the films formed thereby were examined by using a V-SEM equipment.

The gap-fill characteristics were evaluated by examining whether a void was generated or not on the cross-section of the patterns with an electron scanning microscope (SEM). FIG. 1 is a schematic cross-sectional view illustrating how a hardmask composition coated on the surface of a patterned silicon wafer may be evaluated. h1 to h5 indicate the coating thicknesses of the hardmask composition at various locations of the films. Planarization characteristics are excellent as a difference between the h1 and the h2 to h5 is small.

The planarization and gap-fill characteristic results are provided in Table 1.

TABLE 1

| | Planarization characteristics and gap-fill characteristics | | | | | |
|---|---|---|---|---|---|---|
| | h1 (nm) | h2 (nm) | h3 (nm) | h4 (nm) | h5 (nm) | gap-fill characteristics |
| Example 1 | 211.2 | 159.3 | 154.2 | 152.5 | 151.1 | No void |
| Example 2 | 209.2 | 160.1 | 153.6 | 153.6 | 153.0 | No void |
| Example 3 | 206.1 | 175.8 | 168.5 | 162.7 | 159.7 | No void |
| Example 4 | 210.4 | 155.7 | 151.1 | 148.5 | 148.3 | No void |
| Example 6 | 190.8 | 147.3 | 142.7 | 139.9 | 141.5 | No void |
| Comparative Example 1 | 220.4 | 137.1 | 124.0 | 114.2 | 110.9 | Void generation |

Referring to Table 1, the hardmask compositions according to Examples 1 to 4 and 6 maintained very satisfactory thicknesses in the left, middle and right parts of the films and thus, exhibited excellent planarization characteristics compared with the hardmask composition according to Comparative Example 1. In addition, the hardmask compositions according to Examples 1 to 4 and 6 showed no voids and thus, exhibited excellent gap-fill characteristics. In contrast, the hardmask composition according to Comparative Example 1 showed relatively unsatisfactory planarization and gap-fill characteristics. Without being bound to any particular theory, it is believed that the hardmask compositions according to Examples 1 to 4 and 6 provided increased solubility but decreased Tg, as interaction among groups in the respective polymers decreased.

Evaluation 2: Heat Resistance

The hardmask compositions according to Examples 1 to 5 and Comparative Example 2 were respectively spin-on coated on a silicon wafer and heat-treated on a hot plate at 240° C. for 2 minute, forming each thin film. Thicknesses of the thin films were measured by using a thin film thickness measurement instrument made by K-MAC. Subsequently, the thin film was heat-treated at 400° C. for 5 minutes, and the thickness of the heat-treated thin film was measured again.

The results are provided in Table 2.

TABLE 2

|  | Thin film thickness after heat treatment at 240° C. (Å) | Thin film thickness after heat treatment at 400° C. (Å) | Decrease ratio of thin film thickness (%) |
| --- | --- | --- | --- |
| Example 1 | 2875 | 2513 | −12.6 |
| Example 2 | 2902 | 2635 | −9.2 |
| Example 3 | 2901 | 2718 | −6.3 |
| Example 4 | 2893 | 2763 | −4.5 |
| Example 5 | 2896 | 2639 | −8.9 |
| Comparative Example 2 | 2885 | 2063 | −28.5 |

Referring to Table 2, the thin films respectively formed of the hardmask compositions according to Examples 1 to 5 showed less of a thickness decrease ratio than the thin film formed of the hardmask composition according to Comparative Example 2 during the heat treatment at 400° C.

Accordingly, the hardmask compositions according to Examples 1 to 5 showed high heat resistance compared with the hardmask composition according to Comparative Example 2.

By way of summation and review, a general lithographic technique includes providing a material layer on a semiconductor substrate, coating a photoresist layer thereon, exposing and developing the same to provide a photoresist pattern, and etching the material layer using the photoresist pattern as a mask. However, according to the small size of the pattern to be formed, it may be difficult to provide a fine pattern having an excellent profile by only above-mentioned typical lithographic technique. Accordingly, a layer, called a hardmask layer, may be formed between the material layer and the photoresist layer to provide a fine pattern. The hardmask layer plays a role of an intermediate layer for transferring the fine pattern of photoresist to the material layer through the selective etching process. It is desirable for such a hardmask layer to have characteristics such as heat resistance and etch resistance, or the like in order to tolerate multiple etching processes.

It has been recently suggested to form a hardmask layer by a spin-on coating method instead of by chemical vapor deposition. The spin-on coating method is easy to perform and may also improve gap-fill characteristics and planarization characteristics. The spin-on coating method may use a hardmask composition having dissolubility for a solvent. However, the above-described property of dissolubility may be incompatible with the characteristics desirable for a hardmask layer. Accordingly, a hardmask composition having both properties suitable for a hardmask composition and dissolubility desirable for using a spin-on coating is desirable.

Embodiments provide a hardmask composition that satisfies heat resistance while ensuring dissolubility for a solvent, gap-fill characteristics, and planarization characteristics, and a method of forming patterns using the hardmask composition. According to embodiments, characteristics such as heat resistance, etch resistance, planarization characteristics, and gap-fill characteristics required for a hardmask layer may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A hardmask composition, comprising:
   a polymer including a moiety represented by the following Chemical Formula 1, and a solvent:

[Chemical Formula 1]

wherein, in the above Chemical Formula 1,
A is selected from the following Groups 1a and 1b, and
B is selected from the following Group 2,

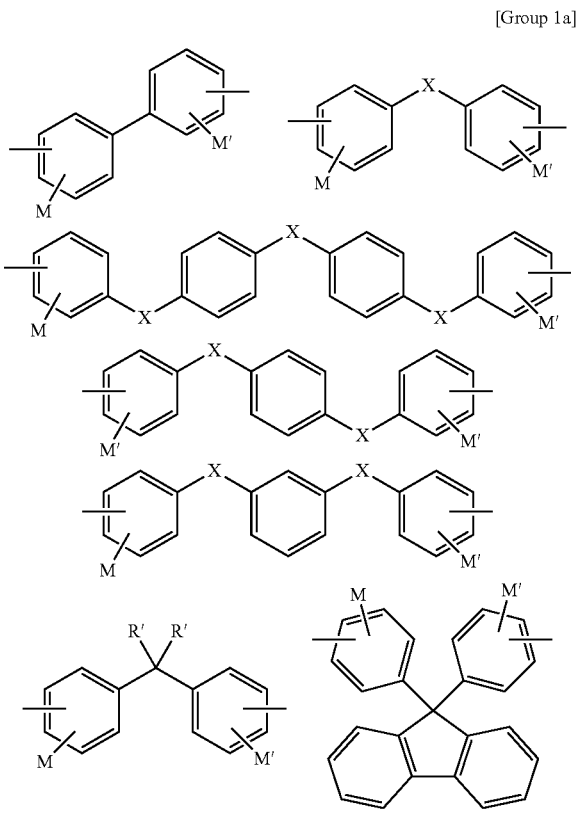

[Group 1a]

[Group 1b]

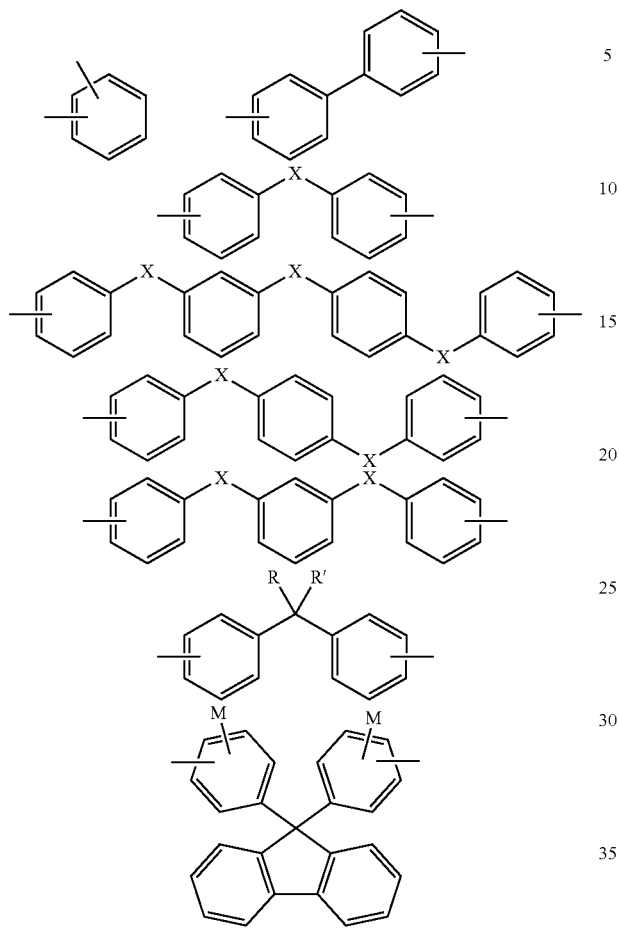

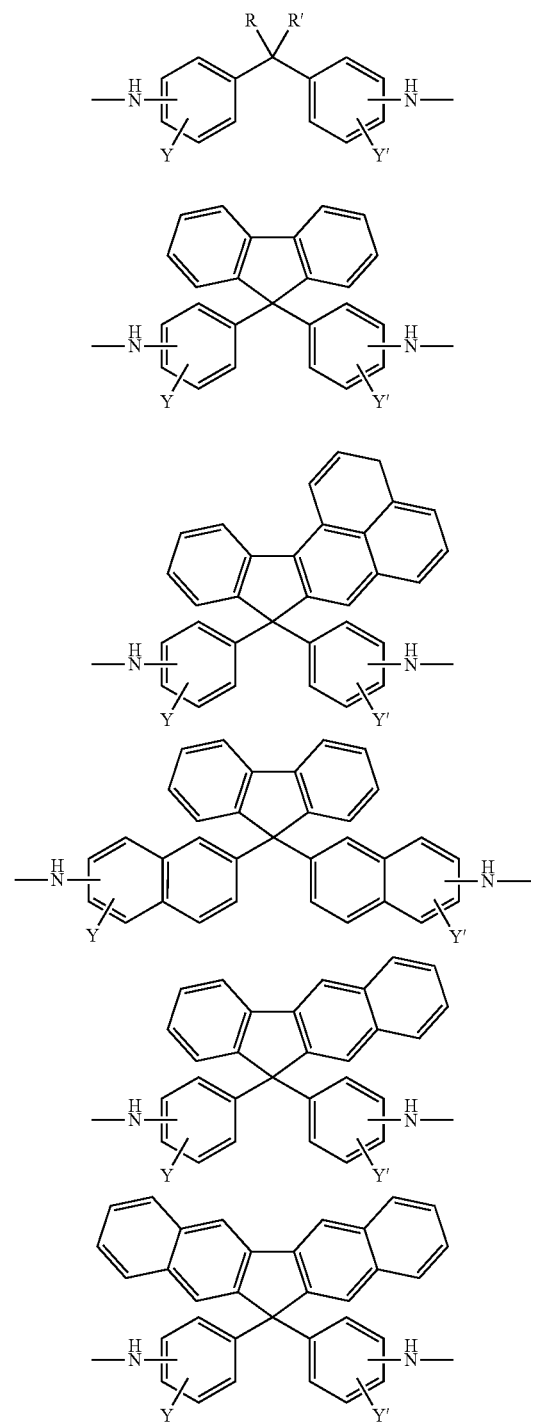

wherein, in Group 1a,

M and M' are a carboxyl group (—COOH), and wherein, in Groups 1a and 1b,

X is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, oxygen (O), sulfur (S), a carbonyl group (—C(=O)—) SO$_2$, NR$^a$, SiR$^b$R$^c$, PR$^d$R$^e$R$^f$, or a combination thereof, and R and R' are independently hydrogen, a halogen, a hydroxy group, a thionyl group, a thiol group, a cyano group, a substituted or unsubstituted amino group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, a substituted or unsubstituted C1 to C20 alkylborane group, a substituted or unsubstituted C6 to C30 arylborane group, CR$^g$R$^h$R$^i$, or a combination thereof, wherein R$^a$, R$^b$, R$^c$, R$^d$, R$^e$, R$^f$, R$^g$, R$^h$ and R$^i$ are independently hydrogen, a substituted or unsubstituted C1 to C10 alkyl group, a halogen, a halogen-containing group, or a combination thereof, -continued

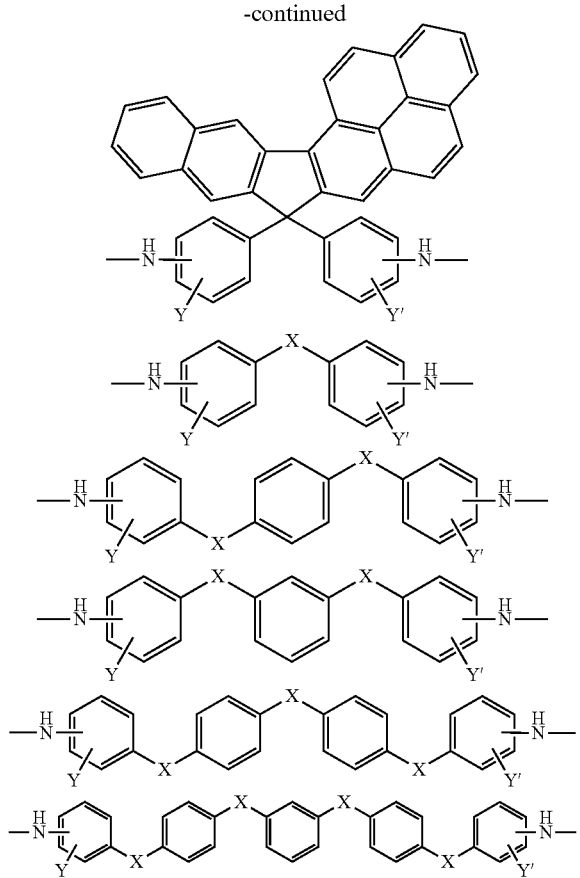

wherein, in Group 2,
Y and Y' are independently hydrogen, a hydroxy group, a thionyl group, a thiol group, a cyano group, a substituted or unsubstituted amino group, a substituted or unsubstituted C1 to C30 alkyl group, a substituted or unsubstituted C1 to C20 alkylamine group, a substituted or unsubstituted C1 to C30 alkoxy group, $NR^aR^b$, $COOR^c$, $PR^jR^kR^lR^m$, or a combination thereof,
X, R and R' are the same as defined in Group 1, and
$R^a$, $R^b$, $R^c$, $R^j$, $R^k$, $R^l$ and $R^m$ are independently hydrogen, a substituted or unsubstituted C1 to C10 alkyl group, a halogen, a halogen-containing group, or a combination thereof.

2. The hardmask composition as claimed in claim 1, wherein, in Groups 1 and 2,
R and R' are independently hydrogen, a halogen, a hydroxy group, a thionyl group, a thiol group, a cyano group, a substituted or unsubstituted amino group, $CR^gR^hR^i$, or a combination thereof, and
$R^g$, $R^h$ and $R^i$ are independently hydrogen, a substituted or unsubstituted C1 to C10 alkyl group, a halogen, a halogen-containing group, or a combination thereof.

3. The hardmask composition as claimed in claim 1, wherein, in Groups 1 and 2,
X is independently oxygen (O), sulfur (S), a carbonyl group (—C(=O)—), $SO_2$, $NR^a$, $SiR^bR^c$, $PR^dR^eR^f$, or a combination thereof, and
$R^a$, $R^b$, $R^c$, $R^d$, $R^e$ and $R^f$ are independently hydrogen, a substituted or unsubstituted C1 to C10 alkyl group, a halogen, a halogen-containing group, or a combination thereof.

4. The hardmask composition as claimed in claim 1, wherein the polymer is represented by one of the following Chemical Formulae 2 to 7:

[Chemical Formula 2]

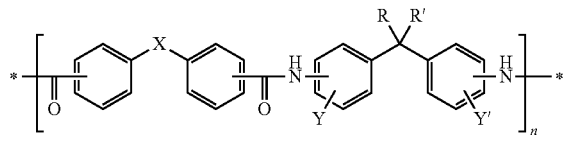

[Chemical Formula 3]

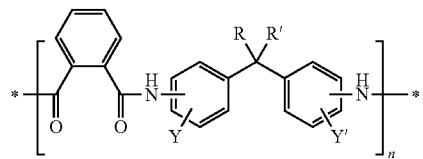

[Chemical Formula 4]

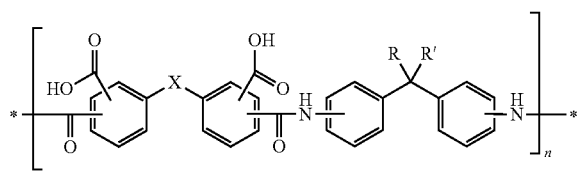

[Chemical Formula 5]

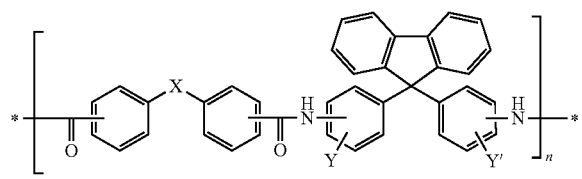

[Chemical Formula 6]

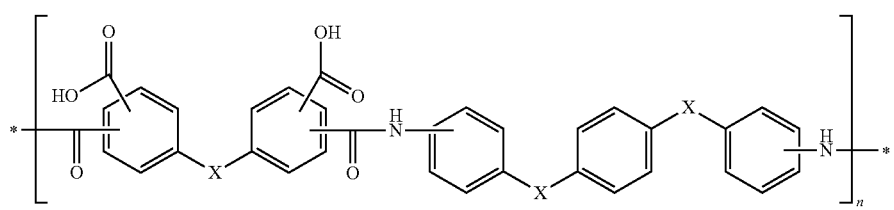

[Chemical Formula 7]

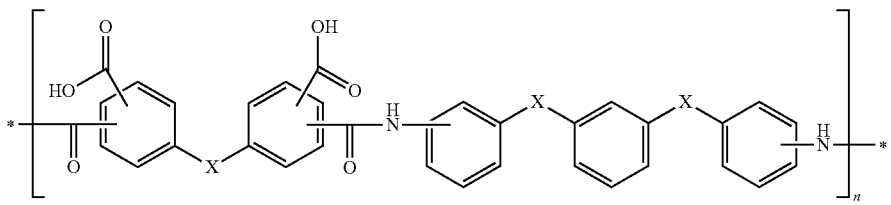

wherein, in the above Chemical Formulae 2 to 7,

X is oxygen (O), sulfur (S), a carbonyl group (—C(=O)—), $SO_2$, $NR^a$, $SiR^bR^c$, $PR^dR^eR^f$, or a combination thereof, Y and Y' are independently a hydroxy group, a thionyl group, a thiol group, a cyano group, a substituted or unsubstituted amino group, a substituted or unsubstituted C1 to C30 alkyl group, a substituted or unsubstituted C1 to C20 alkylamine group, a substituted or unsubstituted C1 to C30 alkoxy group, $NR^aR^b$, $COOR^c$, $PR^jR^kR^lR^m$, or a combination thereof, R and R' are independently hydrogen, a halogen, a hydroxy group, a thionyl group, a thiol group, a cyano group, a substituted or unsubstituted amino group, $CR^gR^hR^i$, or a combination thereof, 2≤n≤10,000, and $R^a$, $R^b$, $R^c$, $R^d$, $R^e$, $R^f$, $R^g$, $R^h$, $R^i$, $R^j$, $R^k$, $R^l$ and $R^m$ are independently hydrogen, a substituted or unsubstituted C1 to C10 alkyl group, a halogen, a halogen-containing group, or a combination thereof.

5. The hardmask composition as claimed in claim 1, wherein the polymer has a weight average molecular weight of about 1,000 to about 200,000.

6. The hardmask composition as claimed in claim 1, wherein the solvent includes at least one selected from propylene glycol monomethyl ether acetate (PGMEA), propylene glycol monomethylether (PGME), cyclohexanone, N-methyl 2-pyrrolidone (NMP), and ethyl lactate.

7. The hardmask composition as claimed in claim 1, wherein the polymer is present in the hardmask composition in an amount of about 0.01 to about 50 parts by weight based on 100 parts by weight of the solvent.

8. A method of forming a pattern the method comprising providing a material layer on a substrate,
applying the hardmask composition as claimed in claim 1 on the material layer,
heat-treating the hardmask composition to form a hardmask layer,
forming a silicon-containing thin layer on the hardmask layer,
forming a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching the exposed part of the material layer.

9. The method as claimed in claim 8, wherein the hardmask composition is applied by a spin-on coating method.

10. The method as claimed in claim 8, wherein the hardmask layer is formed through heat treatment at about 100° C. to about 500° C.

11. The method as claimed in claim 8, further comprising forming a bottom antireflective coating (BARC) layer on the silicon-containing thin layer.

12. The method as claimed in claim 8, wherein the silicon-containing thin layer includes silicon oxynitride (SiON), silicon nitride ($Si_3N_4$) or a combination thereof.

* * * * *